(12) United States Patent
Worledge

(10) Patent No.: US 8,796,045 B2
(45) Date of Patent: Aug. 5, 2014

(54) MAGNETORESISTIVE RANDOM ACCESS MEMORY

(71) Applicant: International Business Machines Corporation, Armonk, NY (US)

(72) Inventor: Daniel C. Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 13/689,102

(22) Filed: Nov. 29, 2012

(65) Prior Publication Data

US 2014/0127831 A1    May 8, 2014

Related U.S. Application Data

(63) Continuation of application No. 13/670,148, filed on Nov. 6, 2012.

(51) Int. Cl.
*H01L 43/08*    (2006.01)
*H01L 27/22*    (2006.01)

(52) U.S. Cl.
USPC ............................................................. 438/3

(58) Field of Classification Search
USPC .................... 438/3; 257/E29.179, E21.665
See application file for complete search history.

(56) References Cited

U.S. PATENT DOCUMENTS

| | | | |
|---|---|---|---|
| 6,385,082 B1 | 5/2002 | Abraham et al. | |
| 6,535,416 B1 | 3/2003 | Daughton et al. | |
| 6,704,220 B2 | 3/2004 | Leuschner | |
| 6,778,429 B1 | 8/2004 | Lu et al. | |
| 6,816,405 B1 | 11/2004 | Lu et al. | |
| 6,822,278 B1 | 11/2004 | Koutny | |
| 6,912,152 B2 | 6/2005 | Iwata et al. | |
| 6,980,468 B1 | 12/2005 | Ounadjela | |
| 7,038,942 B2 | 5/2006 | Ohmori | |
| 7,154,798 B2 | 12/2006 | Lin et al. | |
| 7,177,178 B2 | 2/2007 | Daughton et al. | |
| 7,310,265 B2 | 12/2007 | Zheng et al. | |

(Continued)

FOREIGN PATENT DOCUMENTS

CN    101064184 A    10/2007

OTHER PUBLICATIONS

Daniel C. Worledge, U.S. Appl. No. 13/669,739, filed Nov. 6, 2012, Entitled: Reading a Cross Point Cell Array, pp. 1-38.

(Continued)

*Primary Examiner* — George Fourson, III
(74) *Attorney, Agent, or Firm* — Cantor Colburn LLP; Vazken Alexanian

(57) ABSTRACT

A method of forming a magnetic random access memory (MRAM) device includes forming at least one write line, forming a first insulating layer over the at least one write line and forming a heating line on the first insulating layer. The method includes forming at least one tunnel junction above the at least one write line, the at least one tunnel junction connected to the heating line, forming a second insulating layer on the heating line and forming heat current supply vias at each end of the current line. The method further includes forming heat current supply lines connected to each heat current supply via and forming at least one read line above the at least one tunnel junction and physically connected to the at least one tunnel junction.

9 Claims, 6 Drawing Sheets

(56) References Cited

U.S. PATENT DOCUMENTS

| | | | |
|---|---|---|---|
| 7,349,243 | B2 | 3/2008 | Lin et al. |
| 7,436,698 | B2 | 10/2008 | Lin et al. |
| 7,443,718 | B2 | 10/2008 | Ito et al. |
| 7,499,314 | B2 | 3/2009 | Yang et al. |
| 7,505,347 | B2 | 3/2009 | Rinerson et al. |
| 7,646,627 | B2 | 1/2010 | Hidaka |
| 7,839,710 | B2 | 11/2010 | Kam et al. |
| 7,923,812 | B2 | 4/2011 | Scheuerlein |
| 7,932,513 | B2 | 4/2011 | Hosotani et al. |
| 7,964,919 | B2 * | 6/2011 | Beach et al. .................. 257/379 |
| 7,994,895 | B2 * | 8/2011 | Coolbaugh et al. ............ 338/51 |
| 8,004,881 | B2 | 8/2011 | Zhu et al. |
| 8,031,519 | B2 * | 10/2011 | Javerliac et al. .............. 365/173 |
| 8,064,245 | B2 | 11/2011 | Prejbeanu |
| 8,169,815 | B2 | 5/2012 | Javerliac et al. |
| 8,208,295 | B2 | 6/2012 | Dieny |
| 8,576,615 | B2 * | 11/2013 | El Baraji et al. .............. 365/158 |
| 8,598,679 | B2 * | 12/2013 | Cheng et al. .................. 257/529 |
| 8,611,140 | B2 * | 12/2013 | El Baraji et al. .............. 365/158 |
| 8,611,141 | B2 * | 12/2013 | Baraji et al. .................. 365/158 |
| 2001/0016396 | A1 * | 8/2001 | Lee ............................... 438/412 |
| 2001/0028578 | A1 | 10/2001 | Cunningham et al. |
| 2003/0161197 | A1 | 8/2003 | Iwata et al. |
| 2004/0057263 | A1 | 3/2004 | Tang |
| 2004/0125673 | A1 | 7/2004 | Daughton et al. |
| 2004/0240265 | A1 | 12/2004 | Lu et al. |
| 2005/0243598 | A1 | 11/2005 | Lin et al. |
| 2007/0091672 | A1 | 4/2007 | Lin et al. |
| 2007/0247900 | A1 | 10/2007 | Lin et al. |
| 2007/0253244 | A1 | 11/2007 | Wu et al. |
| 2010/0173488 | A1 | 7/2010 | Van Schaijk et al. |
| 2010/0208516 | A1 | 8/2010 | Javerliac et al. |
| 2011/0002151 | A1 * | 1/2011 | Javerliac et al. ................ 365/50 |
| 2011/0058409 | A1 | 3/2011 | Chen et al. |
| 2011/0242885 | A1 | 10/2011 | Kim |
| 2011/0273930 | A1 | 11/2011 | Chang et al. |
| 2012/0120718 | A1 | 5/2012 | Lou et al. |
| 2012/0153414 | A1 | 6/2012 | Shuto |
| 2012/0201073 | A1 * | 8/2012 | Berger et al. .................. 365/158 |
| 2013/0070520 | A1 * | 3/2013 | El Baraji et al. .............. 365/158 |

OTHER PUBLICATIONS

Daniel C. Worledge, U.S. Appl. No. 13/670,148, filed Nov. 6, 2012, Entitled: Magnetoresistive Random Access Memory, pp. 1-28.

Daniel C. Worledge, U.S. Appl. No. 13/689,953, filed Nov. 30, 2012, Entitled: Reading a Cross Point Cell Array, pp. 1-35.

J.M. Daughton et al., "Design of Curie Point Written Magnetoresistance Random Access Memory Cells"; Journal. Appl. Phys., vol. 93, No. 10; May 15, 2003; 4 pages.

Yiran Chen et al. "A 130 nm 1.2 V/3.3 V 16 Kb Spin-Transfer Torque Random Access Memory with Nondestructive Self-Reference Sensing Scheme," IEEE Journal of Solid-State Circuits, vol. 47, No. 2, Feb. 2012; 14 pages.

Jiale Liang et al., "Cross-Point Memory Array Without Cell Selectors—Device Characterisitics and Data Storage Pattern Dependencies," IEEE Transactions on Electron Devices, vol. 57, No. 10, Oct. 2010; 8 pages.

T.M. Maffitt et al., "Design Considerations for MRAM" IBM J. Res. & Dev.; vol. 50 No. 1; Jan. 2006; 15 pages.

Elaine Ou et al., "Array Architecture for a Nonvolatile 3-Dimensional Cross-Point Resistance-Change Memory," IEEE Journal of Solid-State Circuits, vol. 46, No. 9, Sep. 2011; 13 pages.

* cited by examiner

MAGNETORESISTIVE RANDOM ACCESS MEMORY

CROSS-REFERENCE TO RELATED APPLICATION

This application is a continuation of U.S. patent application Ser. No. 13/670,148, filed Nov. 6, 2012, the disclosure of which is incorporated by reference herein in its entirety.

BACKGROUND

Embodiments of the invention relate generally to magnetoresistive random access memory (MRAM) and, more specifically to a two-adder thermal MRAM.

Magnetoresistive random access memory (MRAM) is a non-volatile computer memory (NVRAM) technology. Unlike conventional RAM chip technologies, MRAM data is not stored as electric charge or current flows, but by magnetic storage elements. The elements are formed from two ferromagnetic plates, each of which can hold a magnetic field, separated by a thin insulating layer. One of the two plates is a reference magnet set to a particular polarity; the other plate's field can be changed to match that of an external field to store memory and is termed the "free magnet" or "free-layer". The free magnet may also be referred to as a bit, and it may store a "1" or a "0" value. This configuration is known as a magnetic tunnel junction and is the simplest structure for a MRAM bit. A memory device is built from a grid of such "cells."

One method of reading is accomplished by measuring the electrical resistance of the cell. A particular cell is (typically) selected by powering an associated transistor which switches current from a supply line through the cell to ground. Due to the magnetic tunnel effect, the electrical resistance of the cell changes due to the orientation of the magnetization in the two plates. By measuring the resistance of any particular cell, the direction of magnetization of the writable plate can be determined.

One type of MRAM, called thermal MRAM, is configured to have heat applied to the tunnel junction when writing to a bit of the tunnel junction. In particular, the free magnet tends to be stable and more difficult to write to, or change magnetic polarity, at a normal operating temperature. Providing heat to the free magnet may facilitate changing of a polarity of the free magnet. In conventional thermal MRAM, current flows through the tunnel junction to heat the free magnet, and the current has been limited by the characteristics of the thin insulating layer, since providing an over-current through the tunnel junction could cause a failure of the thin insulating layer in the tunnel junction. Conventionally, a resistance of the thin insulating layer may be around 1 k$\Omega$, or in a range from around 1 k$\Omega$ to 10 k$\Omega$, and the current flow through such a thin tunnel junction can damage the tunnel barrier.

SUMMARY

According to one embodiment of the present invention, a magnetic random access memory (MRAM) device includes at least one read line, at least one write line and a tunnel junction extending from the at least one read line toward the at least one write line. A heating line is connected to an opposite end of the tunnel junction from the at least one read line. The heating line is configured to supply heat to the tunnel junction based on current flowing through the heating line.

According to one embodiment, a method of forming a magnetic random access memory (MRAM) device. The method includes forming at least one write line, forming a first insulating layer over the at least one write line and forming a heating line on the first insulating layer. The method further includes forming at least one tunnel junction above the at least one write line, and the at least one tunnel junction is connected to the heating line. The method includes forming a second insulating layer on the heating line, forming heat current supply vias at each end of the current line and forming heat current supply lines connected to each heat current supply via. The method further includes forming at least one read line above the at least one tunnel junction and physically connected to the at least one tunnel junction.

Additional features and advantages are realized through the techniques of the present invention. Other embodiments and aspects of the invention are described in detail. For a better understanding of embodiments of the invention, refer to the description and to the drawings.

BRIEF DESCRIPTION OF THE SEVERAL VIEWS OF THE DRAWINGS

Features characterizing embodiments of the present invention are described in the specification and claims which follow. These features, and advantages of embodiments of the invention are apparent from the following detailed description taken in conjunction with the accompanying drawings in which:

DETAILED DESCRIPTION

Conventional write operations in thermal MRAM devices heat a tunnel junction by flowing the current through the tunnel junction or provide more than two adder layers to provide the current. Embodiments of the present invention are directed to a two-mask-adder MRAM device that heats a tunnel junction without directing substantial amounts of current through the tunnel junction.

Figure 1:
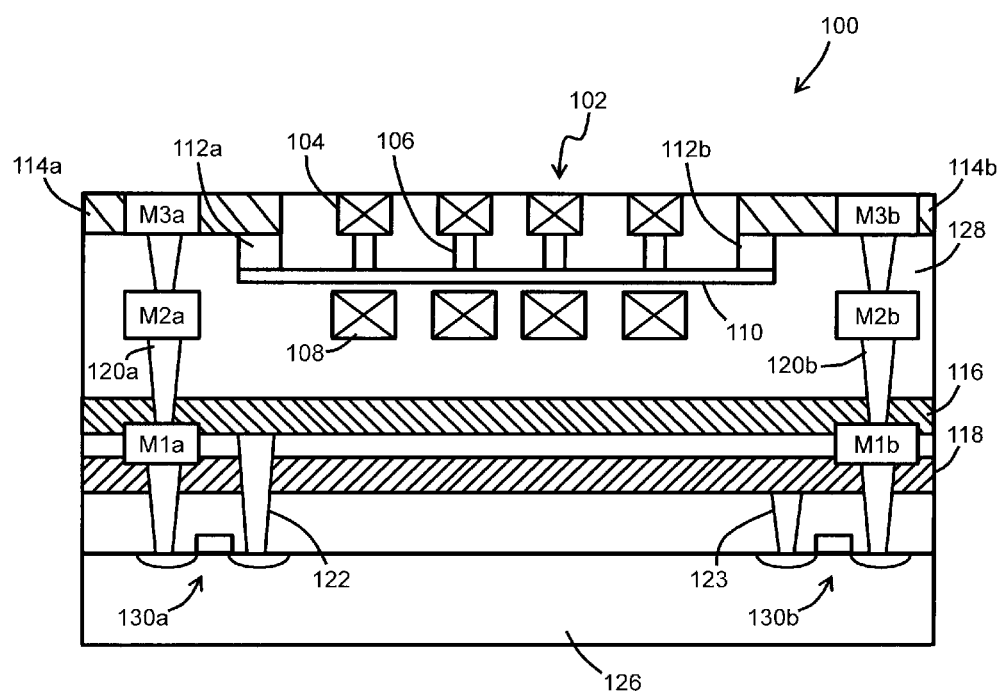
FIG. 1 illustrates a magnetoresistive random access memory (MRAM) device according to one embodiment of the present invention.

FIG. 1 illustrates a magnetoresistive random access memory (MRAM) device 100 according to one embodiment of the present invention. In particular, FIG. 1 illustrates a side view of a cross-section of a portion of an MRAM device 100, and embodiments of the present invention encompass multiple devices 100 arranged in series and in parallel, such as in a grid-like configuration.

The MRAM device 100 includes a cell 102 including a magnetic tunnel junction 106 (referred to hereinafter as "tunnel junction") positioned between a read line 104 and a write line 108. In FIG. 1, four cells 102 are illustrated, although embodiments of the present invention encompass any number of cells 102. In FIG. 1, the "X" of the read and write lines 104 and 108 represent a side cross-section, or in other words, the lines 104 and 108 would extend towards and away from the viewpoint of the figure.

A heating line 110 is located between the write lines 108 and the tunnel junctions 106. The heating line 110 may be electrically connected to the tunnel junctions 106 and electrically separated from the write lines 108, such as by an insulating layer 128. In one embodiment, the write lines 108 may have a cross-sectional area, a width, and/or a height that is greater than a cross-sectional area, a width, and/or a height of the read lines 104. In one embodiment, the tunnel junctions may have a high resistance, such as above 50 kilo-ohms (k$\Omega$). In one embodiment the tunnel junctions have a resistance between 80 k$\Omega$ and 120 k$\Omega$, such as around 100 k$\Omega$. In one embodiment, most of the resistance in the tunnel junctions 106 is a characteristic of the insulation layer in the tunnel junctions 106. For example, when the tunnel junction comprises two or more magnetic layers having a thin insulating layer in between the magnetic layers, the thin insulating layer may have a resistance between around 80 k$\Omega$ and 120 k$\Omega$, such as around 100 k$\Omega$.

The device 100 further includes heat current supply lines 114*a* and 114*b* and heat current supply vias 112*a* and 112*b* connecting the heat current supply lines 114*a* and 114*b* to opposing ends of the heating line 110. Strings of vias 120*a* and 120*b* and metal layer connectors M1*a*, M1*b*, M2*a*, M2*b*, M3*a* and M3*b* connect the heat current supply lines 114*a* and 114*b* with transistors 130*a* and 130*b*. The transistors 130*a* and 130*b* may be formed on and/or in a semiconductor substrate 126. The device 100 further includes a first main heat current supply line 116 and a second main heat current supply line 118. The first and second main heat current supply lines 116 and 118 may be maintained at different voltage potentials, such as at a high voltage potential and ground. In embodiments of the present invention, multiple sets of cells 102 may be arranged in series between respective current supply lines 114*a* and 114*b*. The transistors 130*a* and 130*b* may be turned on to read-to or write-from the cells 102 located between the heat current supply lines 114*a* and 114*b* connected to the transistors 130*a* and 130*b*, respectively.

Although FIG. 1 illustrates the first and second main heat current supply lines 116 and 118 and the metal layer connectors M1*a* and M1*b* as being located at different heights in the device 100, it is understood that these elements may all be formed on the same metal layer, separated by spaces so as to be electrically separated from each other.

Vias 122 and 123 may be formed to connect the first and second main heat current supply lines 116 and 118 to the transistors 130*a* and 130*b*. In particular, the vias may alternate between connecting to the first main heat current supply line 116 and connecting to the second main heat current supply line 118 with each transistor 130*a* and 130*b* arranged in series. For example, in one embodiment, the device 100 illustrated in FIG. 1 may replicated to extend past the end adjacent to transistor 130*b*. In such a case, a next transistor would be connected to the first main heat current supply line 116, a subsequent transistor would be connected to the second heat current supply line 118, etc.

In embodiments of the invention, one source or drain of the transistor 130*a* is connected to the first main heat current supply line 116 and the other one of the source and drain of the transistor 130*a* is connected, by way of the vias 120*a* and metal layer connectors M1*a*, M2*a* and M3*a*, to the heat current supply line 114*a*. Likewise, one source or drain of the transistor 130*b* is connected to the second main heat current supply line 118 and the other one of the source and drain of the transistor 130*b* is connected, by way of the vias 120*b* and metal layer connectors M1*b*, M2*b* and M3*b*, to the heat current supply line 114*b*. For purposes of clarity in description, in FIG. 1, the vias 120*a* and 120*b*, and the metal layer connectors M1*a* and M1*b* do not contact the first and second main heat current supply lines 116 or 118.

In operation, when a write operation is to be performed on one of the magnetic junctions 106, the transistors 130*a* and 130*b* may be turned on to allow a current to flow through the vias 120*a*, the heat current supply line 114*a*, the heat current supply via 112*a*, the heating line 110, the heat current supply via 112*b*, the heat current supply line 114*b* and the vias 120*b*. The current through the heating line 110 provides heat to the magnetic junctions 106 without directing the current through the magnetic junctions 106. In particular, the high resistance of the tunnel junctions 106 may substantially prevent current that flows through the heating line 110 from flowing through the tunnel junctions 106. A current may be supplied to one or more write lines 108 corresponding to one or more magnetic junctions 106 to be programmed, and the magnetic junctions 106 are programmed.

According to embodiments of the invention, only two adder layers 112*a*/112*b* and 110 (i.e. the heat current supply vias 112*a* and 112*b* and the heating line 110) need to be added to an MRAM device to provide heating of the magnetic junctions 106 without requiring the current to flow through the magnetic junctions 106. In embodiments of the present invention, the high resistance (such as between 80 k$\Omega$ and 100 k$\Omega$) of the tunnel junctions 106 may allow for an increased current to be supplied to the read lines 104 or the write lines 108 relative to an MRAM device having tunnel junctions with a lower resistance.

Figure 2:
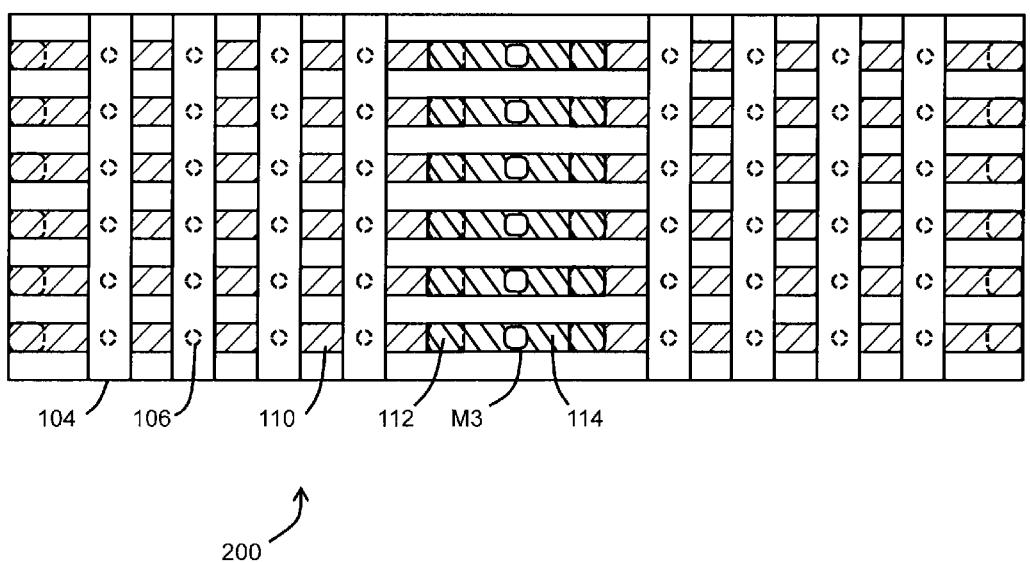
FIG. 2 is a top view of an MRAM array according to an embodiment.

FIG. 2 illustrates a top view of an MRAM array 200 according to one embodiment. As illustrated in FIG. 2, a plurality of heating lines 110 may be connected in series, having a heat current supply line 114 connected between the heating lines 110. The tunnel junctions 106 and heat current supply vias 112 are illustrated with dashed lines to represent the tunnel junctions 106 located beneath the read lines 104 and the heat current supply vias 112 located beneath the heating lines 110.

In embodiments of the present invention, the tunnel junctions 106 may have a diameter or a width less than a diameter or a width of the heat current supply vias 112. The tunnel junctions 106 may have a smaller cross-sectional area than the heat current supply vias 112. For example, the heat current supply vias 112 may have a width or diameter that is substantially the same as a width of the heat current supply line 114. In one embodiment, the MRAM device 200 is arranged as a grid, with read lines 104 and write lines arranged perpendicularly to heating lines 110.

Figure 3:
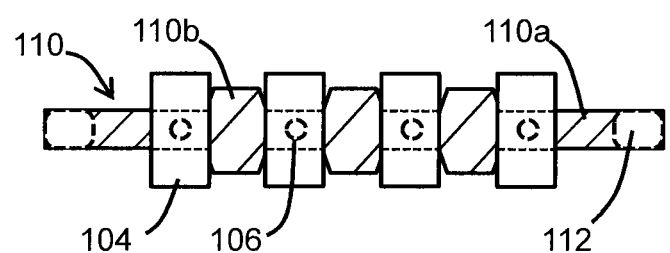
FIG. 3 illustrates a portion of MRAM according to one embodiment.
Figure 4:
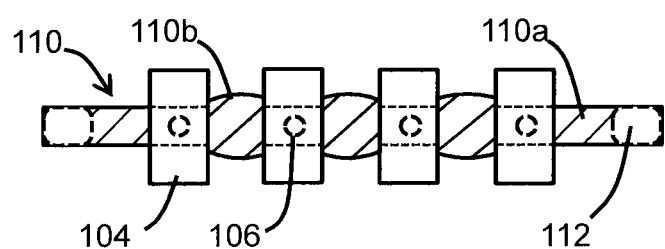
FIG. 4 illustrates a portion of MRAM according to another embodiment.

FIGS. 3 and 4 illustrate alternative configurations of a heating line according to embodiments of the invention. In FIGS. 3 and 4, a portion 110*b* of the heating line 110 between the tunnel junctions 106 is wider than portions adjacent to the tunnel junctions 106 and at ends of the heating lines 110. The wider portion 110*b* may be of any shape. For example, in FIG. 3, the wider portion 110*b* has a polygonal shape, while in FIG. 4, the wider portion 110*b* has a curved, ovoid or ellipse shape. In operation, the wider portion between tunnel junctions 106 and the narrower portion adjacent to the tunnel junctions 106 concentrates the heating at the tunnel junctions 106 to increase efficiency of the heating of the tunnel junctions 106.

Figure 5:
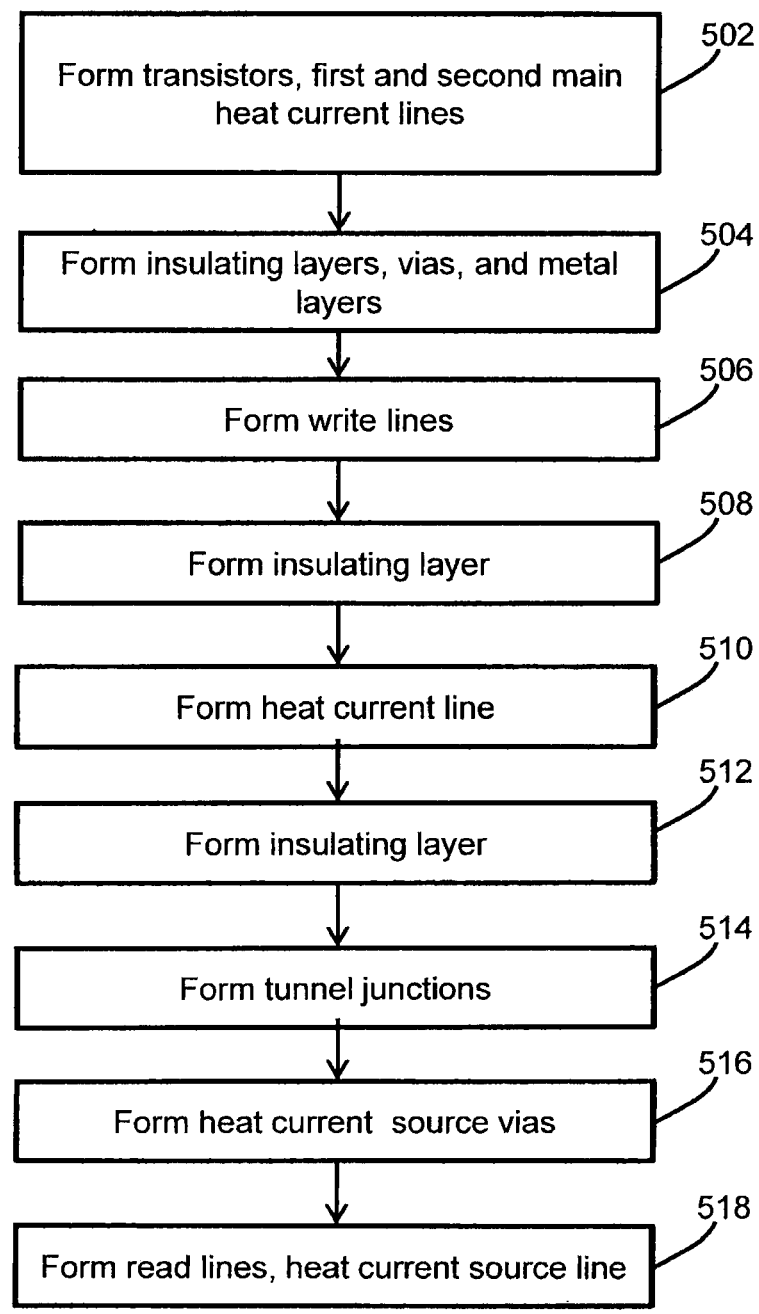
FIG. 5 is a flowchart illustrating a method of forming two-adder MRAM according to another embodiment of the invention.

FIG. 5 is a flowchart illustrating a method of forming an MRAM device according to embodiments of the invention. In block 502, transistors, first and second main heat current supply lines, insulating layers, and vias are formed. In particular, transistors may be formed on or in a substrate, an insulating layer may be formed on the transistors, vias may be formed in the insulating layer, and first and second main heat current supply lines may be formed on the insulating layer to contact some of the vias. In one embodiment, the transistors are arranged in a row and the transistors alternatingly contact the first main heat current supply line and the second main heat current supply line along the row. In block 504, another one or more insulating layers and metal layers may be formed on the first and second main heat current supply lines and vias may be formed through the insulating layers to contact the transistors.

In block 506, write lines are formed on the insulating layer, and an insulating layer may be formed on the write lines in block 508. In block 510, a heating line is formed on the insulating layer above the write lines. In block 512 another insulating layer is formed on the heating line. In block 514, tunnel junctions are formed to contact the heating line, and heat current supply vias are formed in the insulating layer to contact ends of the heating line in block 516.

In block 518, read lines and heat current supply lines may be formed on the insulating layer. The read lines may be formed to contact the tunnel junctions, and the heat current supply line may be formed to contact vias from the transistors and the heat current supply vias. According to one embodiment, only two masks are added to a conventional CMOS formation process to form the MRAM device of the embodiment. In particular, one mask is added to form the heating line and a second mask is added to form the tunnel junctions and the heat current supply vias.

In embodiments of the present invention, the processes of forming heating lines, read lines, write lines, tunnel junctions and vias may be performed by any method, such as by deposition, chemical etching, laser etching, photolithography or any other desired method. The insulating layers may comprise any material, including semiconductive materials like silicon. The lines and vias may be formed of any conductive material, such as metals. In one embodiment, the heating line is formed of tantalum. In one embodiment, a resistivity of the heating line is greater than a resistivity of the heat current supply line. For example, the heating line may be formed of tantalum and the heat current supply line may be formed of copper, aluminum or any other metal having a lower resistivity than tantalum.

As discussed above, in some embodiments, the magnetic junction between the read line and the heating line has a high resistance, such as above 50 kilo-ohms (kΩ). In one embodiment the tunnel junctions have a resistance between 80 kΩ and 120 kΩ, such as around 100 kΩ. The high resistance of the tunnel junction is made possible by the heating line physically connected to one end of the tunnel junction and configured to have current flow from one end of the heating line to the other, instead of passing current through the tunnel junction. Accordingly, in embodiments of the present invention, a current provided to the heating line, and a corresponding heat provided to the tunnel junction, may be increased relative to a configuration in which current flows through the tunnel junction.

In embodiments of the present invention, read operations may be performed based on a normal reference cell read or a self-reference read operation. In particular, in one embodiment, a read operation may be performed by performing a crosspoint cell layer and read scheme by biasing all rows and columns during a read operation.

Figure 6:
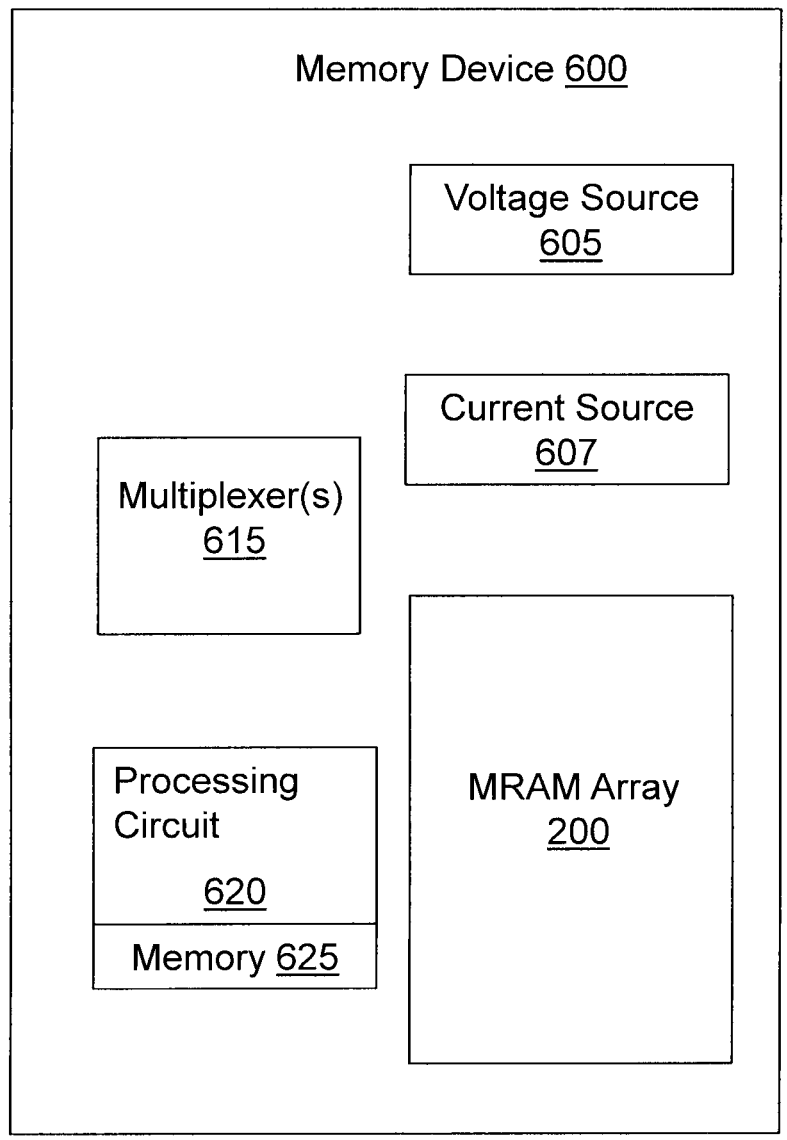
FIG. 6 is a memory device according to an embodiment.

FIG. 6 illustrates a memory device 600 which includes the MRAM array 200 illustrated in FIG. 2. The memory device 600 is controlled by a memory controller which is a processing circuit 620 as understood by one skilled in the art. The processing circuit 620 may be an application specific integrated circuit (ASIC) for operating the MRAM array 200 as disclosed herein. Also, the processing circuit 620 can execute instructions stored in memory 625 to operate the MRAM array 200 as disclosed herein. The memory device 600 includes and/or is operatively connected to one or more voltage sources 605 supplying voltage bias V to the MRAM array 200 as directed by the processing circuit 620, multiplexers 615 directing signals and current sources 607 supplying electrical current to the write bit lines 108 as directed by the processing circuit 620.

Figure 7:
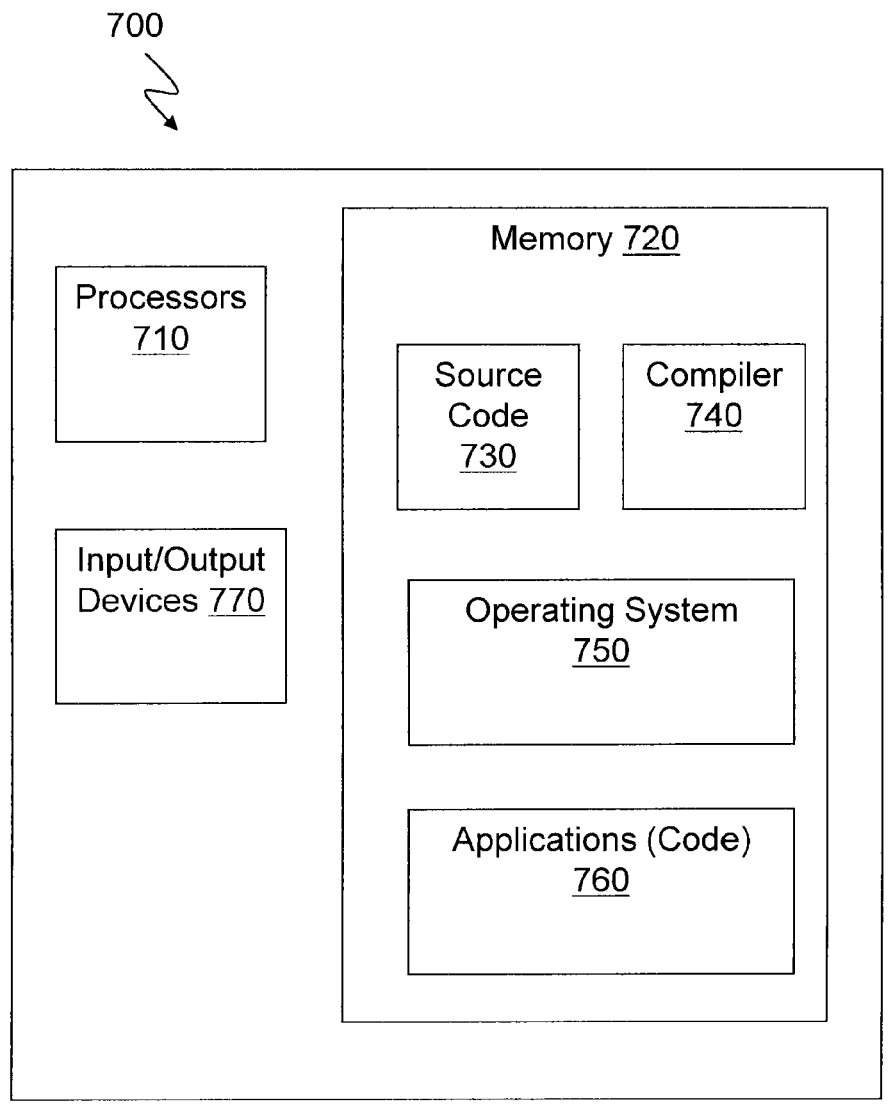
FIG. 7 is a computer including an MRAM array according to an embodiment.

FIG. 7 illustrates an example of a computer 700 (which may include the memory device 600 having the MRAM array 200 to operate the features disclosed herein) having capabilities, which may be included in exemplary embodiments. Various methods, procedures, modules, flow diagrams, tools, applications, circuits, elements, equations, and techniques discussed herein may also incorporate and/or utilize the capabilities of the computer 700. Moreover, capabilities of the computer 700 may be utilized to implement features of exemplary embodiments discussed herein. One or more of the capabilities of the computer 700 may be utilized to implement, to incorporate, to connect to, and/or to support any element discussed herein (as understood by one skilled in the art) in FIGS. 1-5.

Generally, in terms of hardware architecture, the computer 700 may include one or more processors 710, computer readable storage memory 720, and one or more input and/or output (I/O) devices 770 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 710 is a hardware device for executing software that can be stored in the memory 720. The processor 710 can be virtually any custom made or commercially available processor, a central processing unit (CPU), a data signal processor (DSP), or an auxiliary processor among several processors associated with the computer 700, and the processor 710 may be a semiconductor based microprocessor (in the form of a microchip) or a microprocessor.

The computer readable memory 720 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 720 may incorporate electronic, magnetic, optical, and/or other types of storage media. Note that the memory 720 can have a distributed architecture, where various components are situated remote from one another, but can be accessed by the processor 710.

The software in the computer readable memory 720 may include one or more separate programs, each of which comprises an ordered listing of executable instructions for implementing logical functions. The software in the memory 720 includes a suitable operating system (O/S) 750, compiler 740, source code 730, and one or more applications 760 of the exemplary embodiments. As illustrated, the application 760 comprises numerous functional components for implementing the features, processes, methods, functions, and operations of the exemplary embodiments. The application 760 of the computer 700 may represent numerous applications, agents, software components, modules, interfaces, controllers, etc., as discussed herein but the application 760 is not meant to be a limitation.

The operating system 750 may control the execution of other computer programs, and provides scheduling, input-output control, file and data management, memory management, and communication control and related services.

The application 760 may be a source program, executable program (object code), script, or any other entity comprising a set of instructions to be performed. When a source program, then the program is usually translated via a compiler (such as the compiler 740), assembler, interpreter, or the like, which may or may not be included within the memory 720, so as to operate properly in connection with the O/S 750. Furthermore, the application 760 can be written as (a) an object oriented programming language, which has classes of data and methods, or (b) a procedure programming language, which has routines, subroutines, and/or functions.

The I/O devices 770 may include input devices (or peripherals) such as, for example but not limited to, a mouse, keyboard, scanner, microphone, camera, etc. Furthermore, the I/O devices 770 may also include output devices (or peripherals), for example but not limited to, a printer, display, etc. Finally, the I/O devices 770 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 770 also include components for communicating over various networks, such as the Internet or an intranet. The I/O devices 770 may be connected to and/or communicate with the processor 710 utilizing Bluetooth connections and cables (via, e.g., Universal Serial Bus (USB) ports, serial ports, parallel ports, FireWire, HDMI (High-Definition Multimedia Interface), etc.).

When the computer 700 is in operation, the processor 710 is configured to execute software stored within the memory 720, to communicate data to and from the memory 720, and to generally control operations of the computer 700 pursuant to the software. The application 760 and the O/S 750 are read, in whole or in part, by the processor 710, perhaps buffered within the processor 710, and then executed.

When the application 760 is implemented in software it should be noted that the application 760 can be stored on virtually any computer readable storage medium for use by or in connection with any computer related system or method.

The application 760 can be embodied in any computer-readable medium for use by or in connection with an instruction execution system, apparatus, server, or device, such as a computer-based system, processor-containing system, or other system that can fetch the instructions from the instruction execution system, apparatus, or device and execute the instructions.

In exemplary embodiments, where the application 760 is implemented in hardware, the application 760 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

It is understood that the computer 700 includes non-limiting examples of software and hardware components that may be included in various devices, servers, and systems discussed herein, and it is understood that additional software and hardware components may be included in the various devices and systems discussed in exemplary embodiments.

As will be appreciated by one skilled in the art, aspects of the present invention may be embodied as an apparatus, system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the disclosure in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While a preferred embodiment has been described, it will be understood that those skilled in the art, both now and in the future, may make various improvements and enhancements which fall within the scope of the claims which follow.

What is claimed is:

1. A method of forming a magnetic random access memory (MRAM) device, comprising:
   forming at least one write line;
   forming a first insulating layer over the at least one write line;
   forming a heating line on the first insulating layer;
   forming at least one tunnel junction above the at least one write line, the at least one tunnel junction connected to the heating line;
   forming a second insulating layer on the heating line;
   forming heat heating supply vias at each end of the current line;
   forming heat current supply lines connected to each heat current supply via; and
   forming at least one read line above the at least one tunnel junction and physically connected to the at least one tunnel junction, wherein the at least read line, at least one tunnel junction and at least one write line include a plurality of read lines, tunnel junctions and write lines, respectively, the method further comprising: forming the heating line to have a larger width between two adjacent tunnel junctions than adjacent to each tunnel junction.

2. The method of claim 1, wherein the heat current supply lines are on a same metal layer as the at least one read line.

3. The method of claim 1, wherein the at least one write line has a cross-sectional area greater than a cross-sectional area of the at least one read line.

4. The method of claim 1, wherein the heat current supply vias have cross-sectional widths greater than a cross-sectional width of the at least one tunnel junction.

5. The method of claim 1, wherein the heat current supply vias have cross-sectional widths that are substantially the same as cross-sectional widths of the heat current supply lines.

6. The method of claim 1, further comprising:
forming first and second main heat current supply lines; and
alternatingly connecting the first and second main heat current supply lines to the heat current supply lines connected in series with the heating line.

7. The method of claim 6, wherein alternatingly connecting the first and second main heat current supply lines to the heat current supply lines connected in series with the heating line comprises:
forming a plurality of transistors, each transistor having one of a source and a drain connected to a separate heat current supply line and the other of the source and the drain connected to one of the first and second main heat current supply lines.

8. The method of claim 7, further comprising:
forming vias to connect the plurality of transistors to the heat current supply lines and the first and second main heat current supply lines.

9. A method of forming a magnetic random access memory (MRAM) device, comprising: forming at least one write line; forming a first insulating layer over the at least one write line; forming a heating line on the first insulating layer; forming at least one tunnel junction above the at least one write line, the at least one tunnel junction connected to the heating line; forming a second insulating layer on the heating line;

forming heat current supply vias at each end of the heating line;

forming heat current supply lines connected to each heat current supply via; and forming at least one read line above the at least one tunnel junction and physically connected to the at least one tunnel junction, wherein the heating line is formed using one first mask and the tunnel junctions and heat current supply vias are formed using one second mask.

\* \* \* \* \*